(12) United States Patent
Li et al.

(10) Patent No.: US 9,664,971 B2
(45) Date of Patent: May 30, 2017

(54) ARRAY SUBSTRATE AND METHOD FOR PRODUCING THE SAME AND LIQUID CRYSTAL DISPLAY APPARATUS

(71) Applicant: BOE TECHNOLOGY GROUP CO., LTD., Beijing (CN)

(72) Inventors: Hui Li, Beijing (CN); Hyun Sic Choi, Beijing (CN); Zheng Fang, Beijing (CN); Haiyan Wang, Beijing (CN); Yunyun Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/646,645

(22) PCT Filed: Jul. 31, 2014

(86) PCT No.: PCT/CN2014/083386
§ 371 (c)(1),
(2) Date: May 21, 2015

(87) PCT Pub. No.: WO2015/165158
PCT Pub. Date: Nov. 5, 2015

(65) Prior Publication Data
US 2016/0246148 A1    Aug. 25, 2016

(30) Foreign Application Priority Data

Apr. 30, 2014   (CN) .......................... 2014 1 0183210

(51) Int. Cl.
*H01L 23/58* (2006.01)
*G02F 1/1362* (2006.01)
(Continued)

(52) U.S. Cl.
CPC ...... *G02F 1/136286* (2013.01); *G02F 1/1368* (2013.01); *G02F 1/133345* (2013.01);
(Continued)

(58) Field of Classification Search
CPC ............ H01L 27/1214; H01L 27/1251; H01L 27/3244–27/3297; H01L 29/4908;
(Continued)

(56) References Cited

U.S. PATENT DOCUMENTS

| | | |
|---|---|---|
| 2006/0092365 A1 | 5/2006 | Shih et al. |
| 2013/0120684 A1 | 5/2013 | Sato et al. |

(Continued)

FOREIGN PATENT DOCUMENTS

| | | |
|---|---|---|
| CN | 101487958 A | 7/2009 |
| CN | 102062976 A | 5/2011 |

(Continued)

OTHER PUBLICATIONS

International Search Report dated Jan. 6, 2015, for corresponding PCT Application No. PCT/CN2014/083386.
(Continued)

*Primary Examiner* — Cuong B Nguyen
(74) *Attorney, Agent, or Firm* — Kinney & Lange, P.A.

(57) ABSTRACT

The present disclosure provides an array substrate and a method for producing the same and a liquid crystal display apparatus. The array substrate provided by an embodiment of the present invention comprises: a base substrate; a plurality of sub-pixel regions which are delimited by gate lines and data lines respectively and which are located on the base substrate, each of which is provided with a thin film transistor TFT and a common electrode above the thin film transistor; and an alignment film located above the common electrode, wherein the alignment film has an alignment direction at a predetermined angle to the direction in which the gate lines extend, and a void region is arranged at a location of the common electrode corresponding to the thin
(Continued)

film transistor, the direction in which the void region extends being identical to the alignment direction of the alignment film.

18 Claims, 5 Drawing Sheets

(51) Int. Cl.
*H01L 21/77* (2017.01)
*H01L 27/12* (2006.01)
*G02F 1/1333* (2006.01)
*G02F 1/1343* (2006.01)
*G02F 1/1368* (2006.01)
*G02F 1/1337* (2006.01)

(52) U.S. Cl.
CPC .. *G02F 1/134309* (2013.01); *G02F 1/134363* (2013.01); *H01L 21/77* (2013.01); *H01L 27/12* (2013.01); *H01L 27/124* (2013.01); *H01L 27/1259* (2013.01); *G02F 1/1337* (2013.01); *G02F 2001/134318* (2013.01); *G02F 2001/134345* (2013.01); *G02F 2001/134372* (2013.01)

(58) Field of Classification Search
CPC .. H01L 51/0508–51/0533; H01L 2924/13069; H01L 29/41733
See application file for complete search history.

(56) References Cited

U.S. PATENT DOCUMENTS

| 2013/0258256 A1* | 10/2013 | Kim | G02F 1/13363 349/102 |
| 2014/0320791 A1* | 10/2014 | Oiwa | G02F 1/133707 349/123 |
| 2015/0205171 A1* | 7/2015 | Tsuruma | G02F 1/134363 349/46 |

FOREIGN PATENT DOCUMENTS

| CN | 201955591 U | 8/2011 |
| CN | 203826391 U | 9/2014 |

OTHER PUBLICATIONS

Written Opinion dated Jan. 22, 2015, for corresponding PCT Application No. PCT/CN2014/083386.

* cited by examiner

ARRAY SUBSTRATE AND METHOD FOR PRODUCING THE SAME AND LIQUID CRYSTAL DISPLAY APPARATUS

CROSS-REFERENCE TO RELATED APPLICATION(S)

This application claims priorities to Chinese Patent Application Nos. 201410183210.9 filed on Apr. 30, 2014 with the State Intellectual Property Office of China with the title of "AN ARRAY SUBSTRATE AND METHOD FOR PRODUCING THE SAME AND LIQUID CRYSTAL DISPLAY APPARATUS", the disclosures of which are incorporated herein by reference in entirety.

BACKGROUND OF THE INVENTION

Field of the Invention

The present disclosure relates to the technical field of thin film transistor liquid crystal display (TFT-LCD), more particularly, relates to an array substrate and a method for producing the same and a liquid crystal display apparatus.

Description of the Related Art

An advanced super dimension switch (ADS) type liquid crystal display forms a multi-dimensional electric field by an electrical field generated by edges of the slit electrodes in the same plane and an electrical field generated between a slit electrode layer and a plate electrode layer such that all of liquid crystal molecules in any alignment directly above the electrode between the slit electrodes in a liquid crystal cell can rotate so as to improve the work efficiency of the liquid crystal and to enhance the efficiency of light transmission.

The main structure of the TFT-LCD includes an array substrate, a color filter substrate and a liquid crystal layer between them. An ADS mode array substrate is provided thereon with a common electrode and a pixel electrode. When the TFT-LCD works, a constant voltage is applied to the common electrode. If a certain pixel is needed to be activated, gate lines will be controlled to activate the corresponding TFT and data signals are transmitted to the pixel electrode by the activated data lines. An electric field is generated between the common electrode and the pixel electrode due to a voltage difference. The electric field controls the liquid crystal molecules to deflect to achieve the bright and dark display of an image.

When the common electrode is located above the TFT, there is an insulated layer between the common electrode and an active layer of the TFT and a voltage is applied to the common electrode continuously in the phase of image display. Thus, some charges may be coupled out of the active layer of the TFT to form a coupling voltage. The coupling voltage may conduct the source electrode and the drain electrode of the TFT such that the TFT may be activated in undesired time to degrade the image display.

SUMMARY OF THE INVENTION

An embodiment of the present invention provides an array substrate and a method for producing the same and a liquid crystal display apparatus, which may avoid the TFT activation caused by the coupling voltage between the common electrode and the TFT and prevent liquid crystal misalignment in the liquid crystal layer.

The array substrate provided by an embodiment of the present invention comprises: a base substrate; a plurality of sub-pixel regions which are delimited by gate lines and data lines respectively and which are located on the base substrate, each of which is provided with a thin film transistor TFT and a common electrode above the thin film transistor; and an alignment film located above the common electrode, wherein the alignment film has an alignment direction at a predetermined angle to the direction in which the gate lines extend, and a void region is arranged, at a location of the common electrode, corresponding to the thin film transistor, the direction in which the void region extends being identical to the alignment direction of the alignment film.

An embodiment of the present invention provides an array substrate comprising:

a base substrate;

a plurality of sub-pixel regions, each of which is provided with a thin film transistor TFT and a common electrode above the thin film transistor; and a void region arranged, at a location of the common electrode, corresponding to the thin film transistor.

In accordance with an embodiment of the present invention, each of the sub-pixel regions is provided with an alignment film above the common electrode and the alignment film has an alignment direction identical to the direction in which the void region extends.

In accordance with an embodiment of the present invention, the plurality of sub-pixel regions are delimited by gate lines and data lines, respectively, and the alignment film has an alignment direction at a predetermined angle to the direction in which the gate lines extend.

In accordance with an embodiment of the present invention, the void region with the shape of the reversed quadrangular frustum of a pyramid has a first opening far away from the thin film transistor and a second opening close to the thin film transistor, and there is a distance of 1-3 μm between a projection of a side of the first opening in any plane of an internal surface of the void region on the base substrate and a projection of a side of the second opening in the plane on the base substrate.

In accordance with an embodiment of the present invention, there is a distance of 1.5 μm between the projection of the side of the first opening in any plane of the internal surface of the void region on the base substrate and the projection of the side of the second opening in the plane on the base substrate.

In accordance with an embodiment of the present invention, the array substrate further comprises a step projecting away from the thin film transistor on the common electrode, the void region being formed on the step.

In accordance with an embodiment of the present invention, the array substrate further comprises a recess area formed in the region of the alignment film corresponding to the step, and the recess area extends in a horizontal plane along a direction identical to the alignment direction of the alignment film.

In accordance with an embodiment of the present invention, the thin film transistor comprises an active layer above which the void region is located, and the projection of the active layer on the base substrate is within the projection of the void region on the base substrate.

In accordance with an embodiment of the present invention, the void region has a longitudinal section with a shape of reversed trapezoid.

In accordance with an embodiment of the present invention, the void region has a traverse section with a shape of parallelogram.

In accordance with an embodiment of the present invention, the void region has a shape of a reversed quadrangular frustum of a pyramid.

In accordance with an embodiment of the present invention, the void region with the shape of the reversed quadrangular frustum of a pyramid has a first opening close to the alignment film and a second opening far away from the alignment film, and there is a distance of 1-3 μm between a projection of any one side of the first opening pattern on the base substrate and a projection of a side of the second opening pattern parallel to the one side of the first opening on the base substrate.

In accordance with an embodiment of the present invention, there is a distance of 1.5 μm between the projection of the side of the first opening in any plane of the internal surface of the void region on the base substrate and the projection of the side of the second opening in the plane on the base substrate.

In accordance with an embodiment of the present invention, the common electrode is a plane electrode or a slit electrode and a distribution area of slits of the slit electrode at the common electrode corresponds to the area, in which no thin film transistors are arranged, of the sub-pixel regions.

In accordance with an embodiment of the present invention, the array substrate further comprises a pixel electrode located in the sub-pixel region, the pixel electrode being located below and insulated from the common electrode, wherein the pixel electrode is a slit electrode layer.

An embodiment of the present invention provides a liquid crystal display apparatus comprising the array substrate according to any one of the above embodiments.

An embodiment of the present invention provides a method for producing an array substrate comprising:

forming a thin film transistor TFT on each of pixel regions on a base substrate and forming gate lines that are connected to the gate electrode of the TFT and extend in a first direction;

forming a common electrode covering each of the pixel regions on the base substrate formed with the thin film transistor and the gate lines;

forming a void region, at a location of the common electrode, corresponding to the thin film transistor TFT, the void region extending in a second direction at a predetermined angle to the first direction; and forming an alignment film on the common electrode formed with the void region, the alignment film having an alignment direction identical to the second direction.

An embodiment of the present invention provides a method for producing an array substrate comprising:

forming a thin film transistor TFT on each of pixel regions on a base substrate;

forming a common electrode covering each of the pixel regions on the base substrate formed with the thin film transistor; and forming a void region, at a location of the common electrode, corresponding to the thin film transistor.

In accordance with an embodiment of the present invention, the void region extends in a first direction, and the method further comprises forming an alignment film, which has an alignment direction identical to the first direction, on the common electrode formed with the void region.

In accordance with an embodiment of the present invention, gate lines which are connected to a gate electrode of the thin film transistor and extend in a second direction are further formed in each of the pixel regions on the base substrate, wherein the first direction is at a predetermined angle to the second direction.

In accordance with an embodiment of the present invention, forming a void region at the common electrode comprises: forming the void region with the shape of the reversed quadrangular frustum of a pyramid by processing the common electrode, the void region having a first opening far away from the thin film transistor and a second opening close to the thin film transistor, and there is a distance of 1-3 μm between a projection of a side of the first opening in any plane of the void region on the base substrate and a projection of a side of the second opening in the plane on the base substrate.

In accordance with an embodiment of the present invention, the common electrode has a step projecting away from the thin film transistor thereon, the void region being formed on the step.

In accordance with an embodiment of the present invention, a recess area is formed in the region of the alignment film corresponding to the step, and the recess area extends in a horizontal plane along a direction identical to the alignment direction of the alignment film.

In accordance with an embodiment of the present invention, forming a void region at the common electrode comprises forming the void region, at a location of the common electrode, corresponding to an active layer of the thin film transistor TFT, the void region extending in a second direction at a predetermined angle to the first direction.

In accordance with an embodiment of the present invention, forming a void region at the common electrode comprises forming the void region with a longitudinal section of reversed trapezoid and a traverse section of parallelogram by performing the processes of masking, exposing, developing and etching on the common electrode.

In accordance with an embodiment of the present invention, forming a void region at the common electrode comprises forming the void region with the shape of the reversed quadrangular frustum of a pyramid by performing the processes of masking, exposing developing and etching on the common electrode, the void region having a first opening close to the alignment film and a second opening far away from the alignment film, and there is a distance of 1-3 μm between a projection of any one side of the first opening pattern on the base substrate and a projection of a side of the second opening pattern parallel to the side of the first opening pattern on the base substrate.

For a pixel array of the thin film transistor TFT, in a case where the common electrode is located above the TFT, the array substrate provided by an embodiment of the present invention provides a void region at a location of the common electrode, corresponding to the TFT. The void region may reduce or completely avoid overlapping between the common electrode and the TFT active layer so as to avoid or reduce the coupling voltage between the common electrode and the TFT, and thus the activation of the TFT caused by the coupling voltage between the common electrode and the TFT may be prevented. And the alignment film has an alignment direction identical to the direction in which the void region extends and the step is formed in the region, at a location of the common electrode, corresponding to the void region. The alignment film is arranged on a surface of the common electrode on the basis of its shape to form a recess area corresponding to the step and the recess area extends in a horizontal plane along a direction identical to the alignment direction of the alignment film. In this way, all of liquid crystal molecules in the region close to the alignment film and corresponding to the void region have an initial alignment direction identical to the alignment direction of the alignment film, and thus, the misalignment of the liquid crystal molecules may be avoided and the light leak of the liquid crystal display apparatus caused by the misalignment of the initial arrangement of the liquid crystal molecules may be prevented.

DETAILED DESCRIPTION OF EMBODIMENTS OF THE INVENTION

An embodiment of the present invention provides an array substrate and a method for producing the same and a liquid crystal display apparatus, which may avoid the TFT activation caused by the coupling voltage between the common electrode and the TFT and prevent liquid crystal misalignment in the liquid crystal layer.

In an embodiment of the present invention, a void region is provided on a common electrode, corresponding to the TFT, which may avoid an automatic activation of the TFT caused by the coupling voltage between the common electrode and the TFT. And the void region extends in a direction identical to an alignment direction of the alignment film such that the light leak of the liquid crystal display apparatus caused by initial misalignment of the liquid crystal molecules may be prevented.

The term of "misalignment" means that the liquid crystal molecules in the liquid crystal display panel are aligned in a direction deflected from the alignment direction of the alignment film in the initial alignment when they are not driven by an electrical field.

Next, The embodiments of the present invention will be explained with reference to attached drawings.

Figure 1:
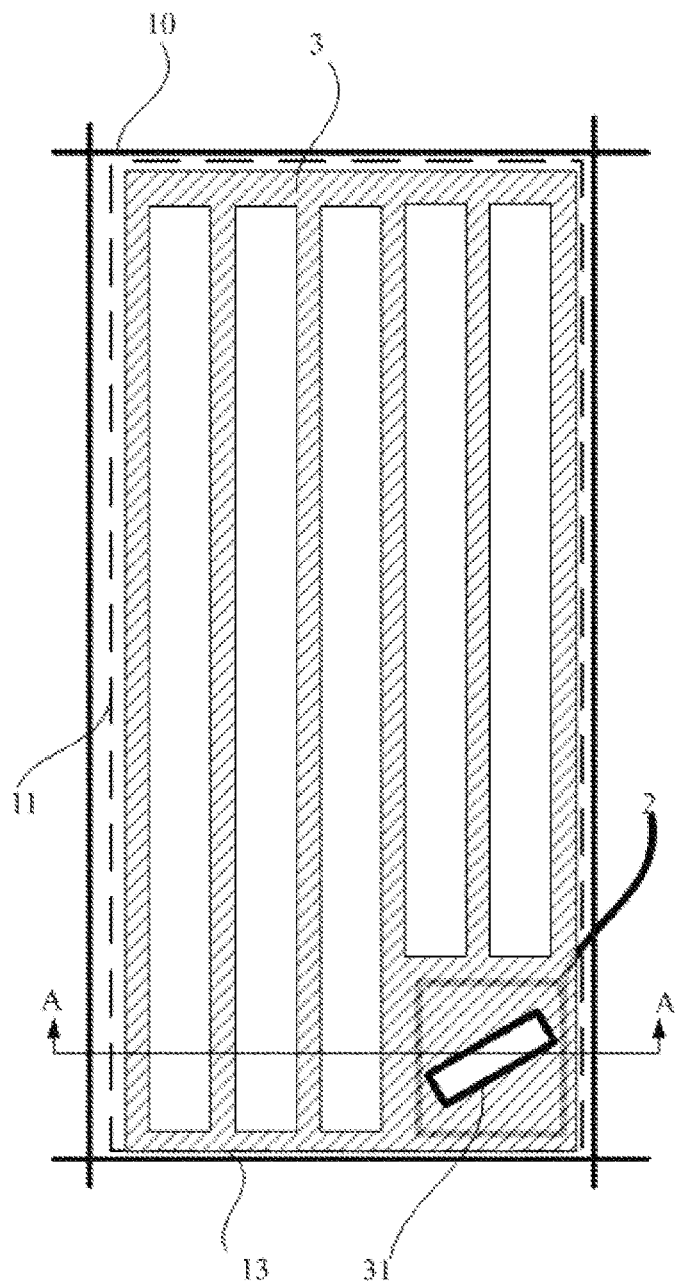
FIG. 1 shows schematically a top view of an array substrate provided by an embodiment of the present invention.
Figure 2:
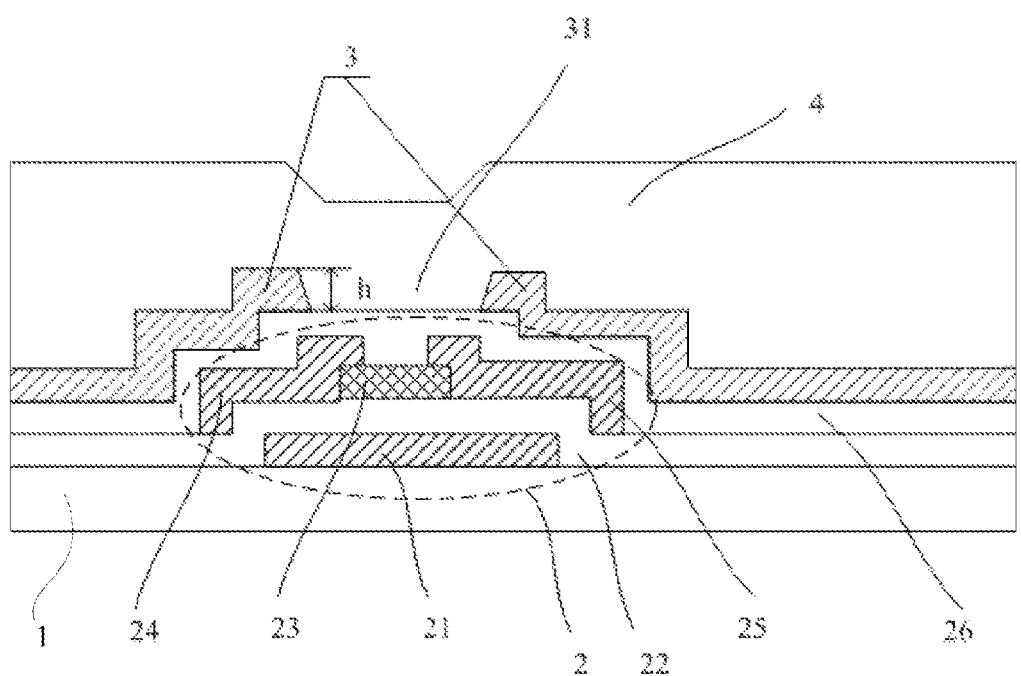
FIG. 2 is a cross sectional view taken along A-A of FIG. 1.

FIG. 1 is a schematic top view of an array substrate. FIG. 2 is a cross sectional view taken along A-A line of the array substrate shown in FIG. 1. With reference to FIGS. 1-2, the array substrate provided by an embodiment of the present invention comprises:

a base substrate (not shown in FIG. 1);

a plurality of sub-pixel regions (one of the sub-pixel regions is shown as an area delimited by a dashed block in FIG. 1) delimited by gate lines 10 and data lines 11 crossing with each other on the base substrate, the gate lines 10 extending in a first direction.

Each of the sub-pixel regions is provided with a thin film transistor TFT2, a common electrode 3 above the thin film transistor TFT2 and an alignment film (not shown in FIG. 1) having an alignment direction, i.e., a second direction at a predetermined angle to the first direction. The alignment film is provided above the common electrode 3. A void region 31 which extends in the second direction is arranged, at a location of the common electrode 3, corresponding to the thin film transistor TFT2. The direction in which the void region 31 extends is identical to the alignment direction of the alignment film.

The position relation of the thin film transistor TFT2 and the common electrode 3 shown in FIG. 1 will be further explained with reference to FIG. 2 which schematically shows a local sectional view taken along A-A line of the array substrate shown in FIG. 1.

As illustrated in FIG. 2, the structure in a closed dashed line is a basic structure of the thin film transistor TFT2. As an example, the thin film transistor TFT2 may be a bottom gate type TFT. In this example, the thin film transistor TFT2 includes: a gate electrode 21 on the base substrate 1, an active layer 23 above the gate electrode 21, a gate insulating layer 22 between the gate electrode 21 and the active layer 23, a source electrode 24 and a drain electrode 25 on the active layer 23 and a passivation layer 26 arranged between the common electrode 3 and the source electrode 24 and the drain electrode 25.

The thin film transistor TFT2 is located below the common electrode 3. The alignment film 4 is located above the common electrode 3. The void region 31 is arranged at a location of the common electrode 3, corresponding to the thin film transistor TFT2. The common electrode 3 has a thickness of h. That is, the thickness of the void region 31 is h.

The relation between the direction in which the void region 31 at the common electrode 3 extends and the alignment direction of the alignment film 4 on the common electrode 3, as shown in FIG. 2, will be further explained with reference to FIG. 3 which shows schematically the relation between the direction in which the void region 31 at the common electrode 3 extends and the alignment direction of the alignment film 4 and the position relation between the void region 31 and the gate lines.

Figure 3:
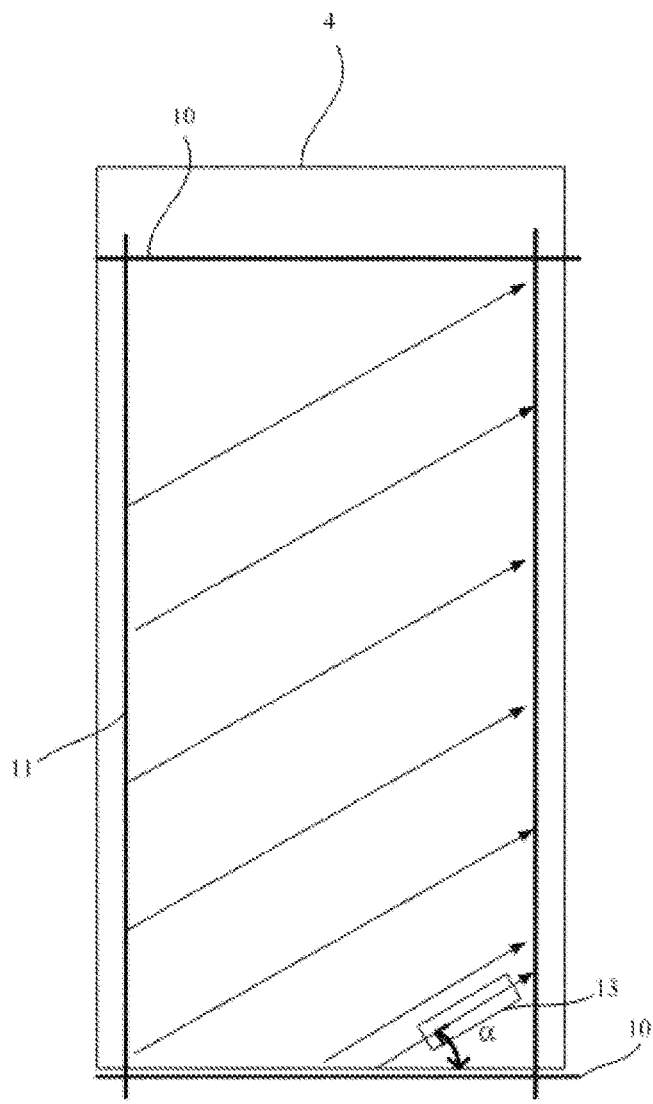
FIG. 3 shows schematically a relation between a direction in which a void region extends on a common electrode as shown in FIG. 1 and an alignment direction of an alignment film.

It can be seen from FIG. 3, the angle formed between the alignment direction (as indicated by an arrow) of the alignment film and the gate lines 10 is a and the direction in which the void region 13 extends is identical to the alignment direction of the alignment film. That is, the direction in which the void region 13 extends is at the angle of a to the gate lines 10.

In the array substrate provided by the above embodiment of the present invention, at first, the void region is provided at a location of the common electrode, corresponding to the TFT, so as to reduce the overlapped face of the common electrode with the TFT, and thus the coupled charges generated by the common electrode applied by a constant voltage Vcom in the TFT may be reduced to decrease the coupling voltage on the TFT. When the gate lines connected with the TFT are not applied with the activation voltage Von, the source electrode and the drain electrode of the TFT will not be conducted due to an automatic activation of the TFT by a large coupling voltage. Further, the direction in which void region extends is identical to the alignment direction of the alignment film and a step is formed in the region, at the common electrode, corresponding to the void region. The step projects away from the thin film transistor on the common electrode and the void region is formed on the step.

The alignment film is arranged on a surface of the common electrode on the basis of its shape to form a recess area corresponding to the step and the recess area extends in a horizontal plane along a direction identical to the alignment direction of the alignment film. In this way, all of liquid crystal molecules in the region close to the alignment film and corresponding to the void region have an initial alignment direction identical to the alignment direction of the alignment film, and thus, the misalignment of the liquid crystal molecules may be avoided and the light leak of the liquid crystal display apparatus caused by the misalignment of the initial arrangement of the liquid crystal molecules may be prevented. In addition, in an embodiment of the present invention, the alignment direction of the alignment film is at a certain angle to the gate lines, that is, the alignment direction of long axes of the liquid crystal molecules is at a certain angle to the gate lines. The response speed for activating the liquid crystal molecules and the response speed for deactivating the liquid crystal molecules may be improved. It is because the gate lines are parallel to certain edges of rectangular sub-pixel units and the alignment direction of long axes of the liquid crystal molecules is at a predetermined angle to the edges of rectangular sub-pixel units. Such alignment direction may be adapted to the case that the liquid crystal molecules between the array substrate and the color filter substrate rotate in the plane parallel to the base substrate. For example, in an example, a space between the array substrate and the color filter substrate is filled with negative liquid crystal molecules. With an effect of a traverse electrical field, the long axes of the negative liquid crystal molecules become aligned with a direction perpendicular to the traverse electrical field from their initial alignment direction such that the long axes of the liquid crystal molecules rotate in a plane parallel to the base substrate and thus the long axes are not affected by a perpendicular electrical field between the color filter substrate and the array substrate, which in turn may improve the response speed for activating the liquid crystal molecules and the response speed for deactivating the liquid crystal molecules.

In other words, the array substrate provided by the embodiment of the present invention may also prevent the light leak of the liquid crystal layer caused by the misalignment of the liquid crystal molecules while avoiding the automatic activation of the TFT caused by the coupling voltage between the common electrode and the TFT. Further, it may improve the response speed for activating the liquid crystal molecules and the response speed for deactivating the liquid crystal molecules and increase the yield of the array substrate compositively.

As the source electrode 24 and the drain electrode 25 of the TFT shown in FIG. 2 are conducted via the active layer 23 of the TFT2 in conductive channel state, the active layer 23 forms the conductive channel and the source electrode 24 and the drain electrode 25 are conducted via the conductive channel when there is a large coupling voltage on the active layer 23.

Figure 4:
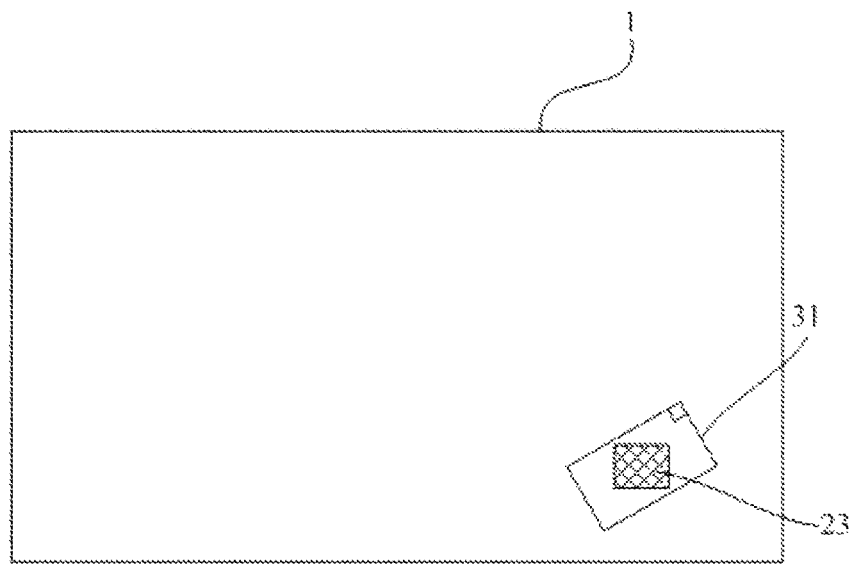
FIG. 4 shows schematically a projection relation of the void region and an active layer of TFT shown in FIG. 1 on a base substrate.

In order to make the void region as small as possible to avoid the effects of too large void region on the alignment of the liquid crystal molecules in the region corresponding to the void region, the array substrate provided by an embodiment of the present invention also needs to ensure that the coupling voltage on the active layer is too weak to activate the TFT. Thus, on the basis of the array substrate provided by the above embodiment, i.e., the array substrate shown in FIGS. 1-2, the void region 31 is located above the active layer 23, as shown in FIG. 2; the projection of the active layer 23 on the base substrate 1 is located in the projection of the void region 31 on the base substrate 1, as shown in FIG. 4. The void region 31 may be elongated.

In the array substrate provided by an embodiment of the present invention, as the void region 31 is located at the common electrode 3, the common electrode 3 has a predetermined thickness. Thus, as shown in FIG. 2, the void region 31 has a perpendicular depth h equal to the thickness of the common electrode 3. In order to prevent the alignment film in the region corresponding to the void region from forming a fault due to a steep wall in the void region, in an embodiment of the present invention, as shown in FIG. 2, a longitudinal section of the void region 31 has a shape of reversed trapezoid. It will be understood that the void region 31 has a side wall in a slope shape, that is, the cross section of the void region 31 close to the base substrate 1 is less than that of the void region 31 away from the base substrate 1.

In particular, when the alignment film 4 is formed on the common electrode 3, as the longitudinal section of the void region 31 has the shape of reversed trapezoid and the alignment film 4 is formed on the region corresponding to the void region 31 on the basis of the shape of the void region, the alignment film 4 forms a recess area with a sloped shape on the region corresponding to the void region 31 and there is no risk that a fault occurs in the alignment film 4. Further, when the liquid crystal molecules are distributed in the recess area, the recess area has a function of aligning the liquid crystal molecules similar to the scrubbed alignment film. The alignment direction of the recess area is identical to that of the alignment film.

According to an embodiment of the present invention, the void region may have a traverse section of such as bar shape, rectangular shape or parallelogram shape. When the traverse section of the void region is the rectangular shape or parallelogram shape, preferably, the void region has a shape of a reversed quadrangular frustum of a pyramid.

According to an embodiment of the present invention, the void region with the shape of the reversed quadrangular frustum of a pyramid has a first opening close to the alignment film or far away from the thin film transistor and a second opening away from the alignment film or close to the thin film transistor, and there is a distance of 1-3 μm between a projection of a side of the first opening in any plane of an internal surface of the void region on the base substrate and a projection of a side of the second opening in the plane on the base substrate. The side of the first opening is parallel to the side of the second opening.

In particular, in a further embodiment, with reference to FIG. 2, the first opening is located at an end of the void region 31 close to the alignment film 4 and the second opening is located at an end of the void region 31 close to the TFT2. The first opening and the second opening have rectangular patterns. The void region 31 has the shape of the reversed quadrangular frustum of a pyramid. Such arrangement may ensure the wall of the void region 31 to have a regular structure and may further ensure the alignment film 4 to form the recess area with the shape of the reversed quadrangular frustum of a pyramid in the region corresponding to the void region 31. On one hand, it further prevents the fault from occurring in the alignment film, on the other hand, it may further ensure the void region to have a more regular structure such that the recess area in the alignment film can have a more regular structure to prevent the misalignment of the liquid crystal molecules more efficiently and to prevent the light leak of the liquid crystal display apparatus caused by the misalignment of the initial alignment of the liquid crystal molecules.

Figure 5:
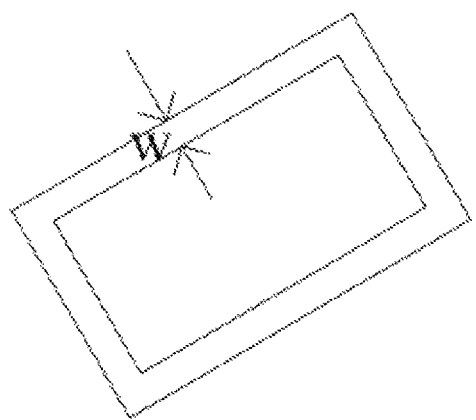
FIG. 5 shows schematically a relative position of patterns of a first opening and a second opening on the void region shown in FIG. 1.

In a further embodiment, as illustrated in FIG. 5, the distance w between the projection of the side of the first opening in any plane of the internal surface of the void region on the base substrate and the projection of the side of the second opening in the plane on the base substrate is 1-3 μm. If the thickness h of the common electrode is constant, the slope angle of the wall of the void region 31 will be determined.

According to an embodiment of the present invention, there is a distance of 1.5 μm between a projection of any side of the first opening pattern on the base substrate and a projection of a side of the second opening pattern parallel to the side of the first opening on the base substrate.

In the above embodiment, as the projection of the active layer 23 on the base substrate 1 is located within the projection of the void region 31 on the base substrate 1, that is, the projection of the active layer 23 on the base substrate 1 is located within the projection of the second opening pattern, the active layer 23 and the void region 31 have no overlapped regions, which ensures that no coupling voltage on the active layer 23 is produced by the common electrode. The distance between the first opening and the second opening being 1-3 μm may not only ensure the first opening to be smaller, but also ensure the wall of the void region to have a certain slope, so as to avoid adverse effects of faults in the alignment film.

The common electrode provided by any one of the above embodiments of the present invention may be a plane electrode or a slit electrode. For example, the common electrode 3 shown in FIG. 1 is the slit electrode. The slit electrode has slits that have distribution area at the common electrode corresponding to the area in which no TFTs are provided in the sub-pixel region. That is, the slits at the common electrode and the TFT have no overlapped regions and no slits are located directly above the TFT.

The array substrate provided by an embodiment of the present invention further includes a pixel electrode electrically connected to the drain electrode of the TFT. The pixel electrode is located below the common electrode and insulated from the common electrode. The pixel electrode is a slit electrode.

When the pixel electrode layer and the common electrode are both applied with a voltage, a traverse electrical field is generated to control the liquid crystal molecules between the color filter substrate and the array substrate to deflect so as to control the light transmittance of the rays.

When the pixel electrode layer and the common electrode are both in slit-like shapes, a multi-dimensional electrical field is generated such that all of liquid crystal molecules in any alignment directly above the electrode between the slit electrodes in a liquid crystal cell can rotate so as to improve the work efficiency of the liquid crystal and to enhance the efficiency of light transmission.

In the array substrate provided by an embodiment of the present invention, the arrangement shown in FIG. 2 is only used to explain the relative position among the respective components, instead of explaining the specific structure of each of functional layers.

An embodiment of the present invention provides a liquid crystal display apparatus comprising the array substrate in any of the above embodiments.

As an example, the liquid crystal display apparatus includes the array substrate, and may further include the color filter substrate and the liquid crystal layer between them; or the liquid crystal display apparatus only includes the array substrate which at least further includes a color filter film.

The liquid crystal display apparatus may be a liquid crystal display panel, a liquid crystal display, a liquid crystal TV or the like.

Figure 6:
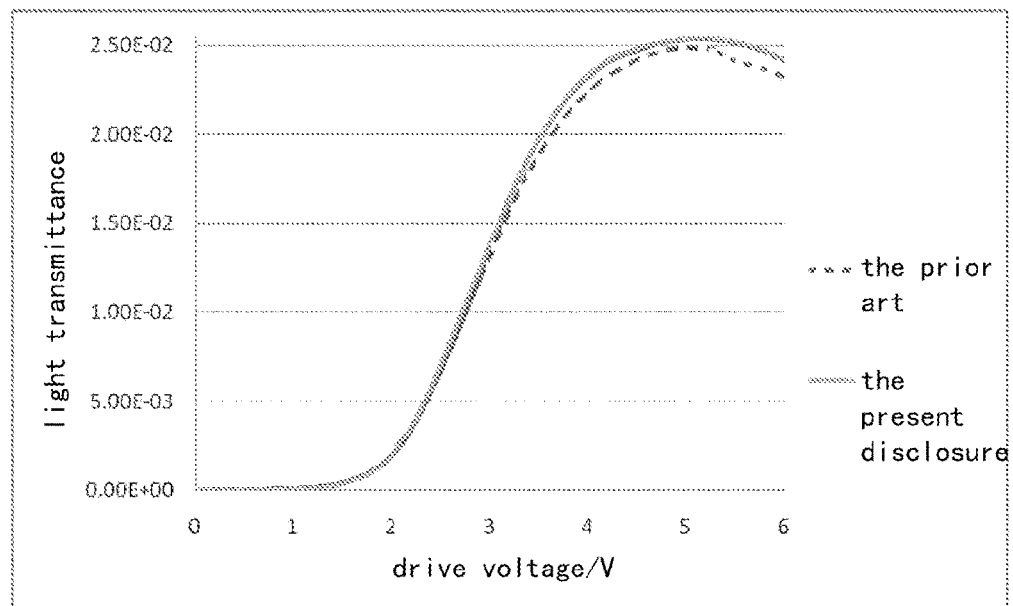
FIG. 6 shows schematically a graph of a relation between light transmittance of a liquid crystal display apparatus provided by an embodiment of the present invention and driving voltage v.s. a relation between light transmittance of the conventional liquid crystal display apparatus and driving voltage.

In the array substrate provided by any one of the above embodiments of the present invention, as it prevents the misalignment of liquid crystal molecules in the liquid crystal layer, the light transmittance of the liquid crystal display apparatus is improved in comparison with the prior art. FIG. 6 schematically shows the relation between the pixel drive voltage V (i.e., grey scale voltage of the pixels) and the light transmittance T of the liquid crystal display apparatus provided by an embodiment of the present invention, which is derived by software simulation. It can be known from FIG. 6 that the light transmittance of the liquid crystal display apparatus provided by an embodiment of the present invention is greater than that of the liquid crystal display apparatus in the prior art, with the same drive voltage.

Figure 7:
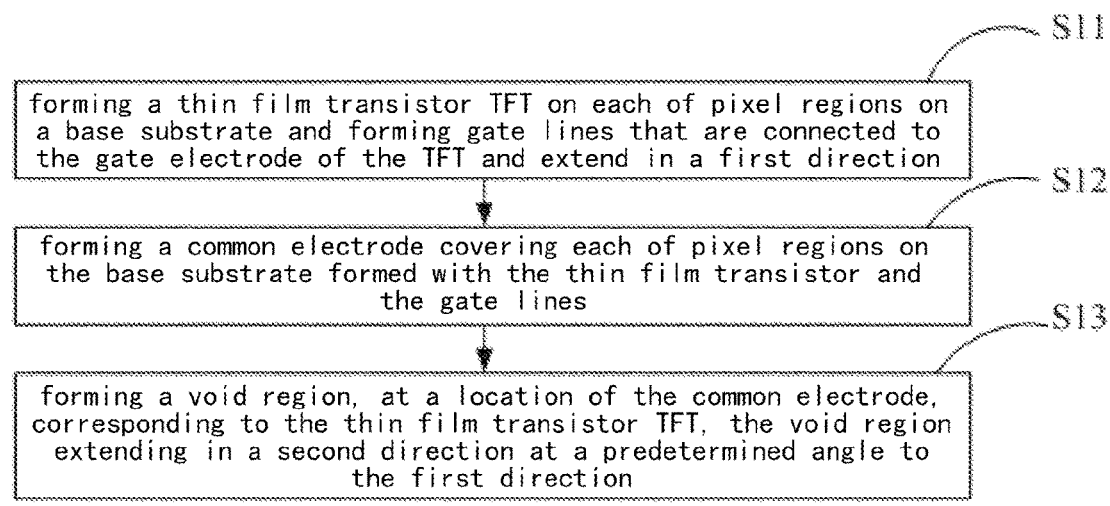
FIG. 7 shows schematically a general flow chart of a method for producing an array substrate provided by an embodiment of the present invention.

An embodiment of the present invention also provides a method for producing an array substrate, as illustrated in FIG. 7. The method generally includes the following steps:

Step S11 of forming a thin film transistor TFT on each of pixel regions on a base substrate and forming gate lines that are connected to the gate electrode of the TFT and extend in a first direction;

Step S12 of forming a common electrode covering each of pixel regions on the base substrate formed with the thin film transistor and the gate lines; and Step S13 of forming a void region, at a location of the common electrode, corresponding to the thin film transistor TFT, the void region extending in a second direction at a predetermined angle to the first direction.

In an example, a void region, at a location of the common electrode, corresponding to an active layer of the thin film transistor TFT is formed, the void region extending in a second direction at a predetermined angle to the first direction.

In an example, a void region with a longitudinal section of reversed trapezoid and a traverse section of parallelogram is formed by performing the processes of masking, exposing, developing and etching on the common electrode. In particular, the void region with the longitudinal section of reversed trapezoid may be formed at the common electrode by controlling the exposure degree and the void region with the traverse section of parallelogram may be formed by setting the pattern of the mask.

Further, a void region with the shape of the reversed quadrangular frustum of a pyramid is formed by performing the processes of masking, exposing, developing and etching on the common electrode, the void region having a first opening close to the alignment film and a second opening far away from the alignment film, and there is a distance of 1-3 μm between a projection of any one side of the first opening pattern on the base substrate and a projection of a side of the second opening pattern parallel to the side of the first opening pattern on the base substrate.

Further, the method may include forming a slit in an opening area of the pixels at the common electrode to improve the light transmittance of the liquid crystal display apparatus. Further, before forming the common electrode and after forming the TFT, the method may further include:

forming a pixel electrode on each of the pixel regions on the base substrate, the pixel electrode being insulated from the common electrode by an insulation layer.

The process for producing the array substrate provided by an embodiment of the present invention will be explained briefly below.

The process will be explained with reference to the array substrate shown in FIG. 2.

Step 1: forming a metal thin film on the base substrate 1 and forming a gate electrode pattern and gate line patterns extending in a first direction by a patterning process;

Step 2: forming a gate electrode insulation layer, a semiconductor thin film sequentially on the base substrate processed by the Step 1, and forming an active layer pattern by patterning the semiconductor thin film, wherein the active layer pattern is a regular pattern, such as rectangle;

Step 3: forming a metal thin film on the base substrate processed by the Step 2, and forming a source electrode pattern and a drain electrode pattern by a patterning process;

Step 4: depositing a passivation layer after the Step 3, and forming a via communicating the pixel electrode to the drain electrode on the passivation layer by a patterning process, the via being above the drain electrode;

Step 5: depositing a transparent conductive thin film after the Step 4, and forming the pixel electrode and the common electrode provided with a void region therein by a patterning process, the common electrode being connected to the drain electrode by the via in the passivation layer, the void region formed in the common electrode having a maximum opening which is greater than the active layer of the TFT by about 1.5 µm and extends in a second direction at a predetermined angle to the first direction, wherein the direction in which the void region extends is identical to the liquid crystal friction direction (i.e., alignment direction) of the alignment film, and the common electrode formed when it is applied with a voltage contributes to the alignment of the liquid crystal molecules at the step;

Step 6: forming an alignment film following the Step 5, the alignment direction of the alignment film being identical to the second direction.

For a pixel array of the thin film transistor TFT, in a case where the common electrode is located above the TFT, the array substrate provided by the embodiment of the present invention provides a void region at a location of the common electrode, corresponding to the TFT. The void region may reduce or completely avoid overlapping between the common electrode and the TFT active layer so as to avoid or reduce the coupling voltage between the common electrode and the TFT, and thus the activation of the TFT caused by the coupling voltage between the common electrode and the TFT may be prevented. And the alignment film has an alignment direction identical to the direction in which the void region extends and a step is formed in the region at the common electrode corresponding to the void region. The alignment film is arranged on a surface of the common electrode on the basis of its shape to form a recess area corresponding to the step and the recess area extends in a horizontal plane along a direction identical to the alignment direction of the alignment film. In this way, all of liquid crystal molecules in the region close to the alignment film and corresponding to the void region have an initial alignment direction identical to the alignment direction of the alignment film, and thus, the misalignment of the liquid crystal molecules may be avoided and the light leak of the liquid crystal display apparatus caused by the misalignment of the initial arrangement of the liquid crystal molecules may be prevented. In addition, the light transmittance of the liquid crystal display apparatus including the array substrate provided by an embodiment of the present invention may be improved because the misalignment is suppressed. It achieves a liquid crystal display apparatus with a high light transmittance and no light leak.

It would be appreciated by those skilled in the art that various changes or modifications may be made to the present disclosure without departing from the spirit and scope of the present invention. Thus, these changes or modifications will be intended to be comprised in the present invention as long as they fall within the scope of the appended claims of the present application and the equivalent thereof.

What is claimed is:

1. An array substrate comprising:
   a base substrate;
   a plurality of sub-pixel regions, each of which is provided with a thin film transistor and a common electrode above the thin film transistor; and
   a void region arranged at a location of the common electrode corresponding to the thin film transistor, wherein each of the sub-pixel regions is provided with an alignment film located above the common electrode and the alignment film has an alignment direction identical to the direction in which the void region extends;
   wherein the thin film transistor comprises an active layer, and wherein the void region is located above the active layer, and a vertical projection of the active layer on the base substrate is within a vertical projection of the void region on the base substrate.

2. The array substrate according to claim 1, wherein the plurality of sub-pixel regions are delimited by gate lines and data lines, respectively, and the alignment film has the alignment direction at a predetermined angle to the direction in which the gate lines extend.

3. The array substrate according to claim 1, wherein the void region has a longitudinal section with a reversed trapezoid shape.

4. The array substrate according to claim 1, wherein the void region has a traverse section with a parallelogram shape.

5. The array substrate according to claim 1, wherein the void region has a shape of a reversed quadrangular frustum of a pyramid.

6. The array substrate according to claim 5, wherein the void region with the shape of the reversed quadrangular frustum of the pyramid has a first opening far away from the thin film transistor and a second opening close to the thin film transistor, and there is a distance of 1-3 µm between a projection of a side of the first opening in any plane of an internal surface of the void region on the base substrate and a projection of a side of the second opening in the plane on the base substrate.

7. The array substrate according to claim 6, wherein there is a distance of 1.5 µm between the projection of the side of the first opening in any plane of the internal surface of the void region on the base substrate and the projection of the side of the second opening in the plane on the base substrate.

8. The array substrate according to claim 1, wherein the common electrode is a plane electrode or a slit electrode and a distribution area of slits of the slit electrode at the common electrode corresponds to the area, in which no thin film transistors are arranged, of the sub-pixel regions.

9. The array substrate according to claim 1, further comprising a pixel electrode located in the sub-pixel region, the pixel electrode being located below and insulated from the common electrode, wherein the pixel electrode is a slit electrode.

10. The array substrate according to claim 1, further comprising a step projecting away from the thin film transistor on the common electrode, the void region being formed on the step.

11. The array substrate according to claim 10, further comprising a recess area formed in the region of the alignment film corresponding to the step, and the recess area extends in a horizontal plane along a direction identical to the alignment direction of the alignment film.

12. A liquid crystal display apparatus comprising the array substrate according to claim 1.

13. The array substrate according to claim 1, wherein the void region is elongated and the alignment direction of the alignment film is identical to a lengthwise direction of the void region.

14. A method for producing an array substrate, comprising the steps of:
   forming a thin film transistor on each of a plurality of sub-pixel regions on a base substrate;
   forming a common electrode covering each of the sub-pixel regions on the base substrate formed with the thin film transistor; and
   forming a void region at a location of the common electrode corresponding to the thin film transistor, wherein the void region extends in a first direction, and the method further comprises forming an alignment film, which has an alignment direction identical to the first direction, above the common electrode formed with the void region;
   wherein the thin film transistor is formed with an active layer, and wherein the void region is located above the active layer, and a vertical projection of the active layer on the base substrate is within a vertical projection of the void region on the base substrate.

15. The method according to claim 14, wherein gate lines which are connected to a gate electrode of the thin film transistor and extend in a second direction are further formed in each of the sub-pixel regions on the base substrate, wherein the first direction is at a predetermined angle to the second direction.

16. The method according to claim 14, wherein forming a void region at the common electrode comprises: forming the void region with a shape of a reversed quadrangular frustum of a pyramid by processing the common electrode, the void region having a first opening far away from the thin film transistor and a second opening close to the thin film transistor, and there is a distance of 1-3 μm between a projection of a side of the first opening in any plane of the void region on the base substrate and a projection of a side of the second opening in the plane on the base substrate.

17. The method according to claim 14, wherein the common electrode has a step projecting away from the thin film transistor thereon, the void region being formed on the step.

18. The method according to claim 14, wherein a recess area is formed in the region of the alignment film corresponding to the step, and the recess area extends in a horizontal plane along a direction identical to the alignment direction of the alignment film.

* * * * *